(12) United States Patent
Fuderer

(10) Patent No.: US 7,330,575 B2
(45) Date of Patent: Feb. 12, 2008

(54) DETERMINATION OF SUBENCODING MRI COIL SENSITIVITIES IN A LOWER ORDER MAGNETIC FIELD

(75) Inventor: Miha Fuderer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 461 days.

(21) Appl. No.: 10/536,284

(22) PCT Filed: Nov. 20, 2003

(86) PCT No.: PCT/IB03/05317

§ 371 (c)(1),
(2), (4) Date: May 25, 2005

(87) PCT Pub. No.: WO2004/048991

PCT Pub. Date: Jun. 10, 2004

(65) Prior Publication Data

US 2006/0058628 A1    Mar. 16, 2006

(30) Foreign Application Priority Data

Nov. 26, 2002  (EP)  ................................. 02079910

(51) Int. Cl.
G06K 9/00 (2006.01)
G01V 3/00 (2006.01)

(52) U.S. Cl. ...................... 382/128; 324/300; 324/318; 324/303; 324/309; 600/410

(58) Field of Classification Search ................ 324/300, 324/318, 303; 600/420, 410; 382/131, 274, 382/284, 128

See application file for complete search history.

(56) References Cited

U.S. PATENT DOCUMENTS 5,633,585 A    5/1997  Kuhn
5,910,728 A *  6/1999  Sodickson .................. 324/309
6,031,373 A *  2/2000  Szeles et al. ............... 324/300

(Continued)

OTHER PUBLICATIONS

Ballester, M.A.G., et al.; Robust Estimation of Coil Sensitivities for RF Subencoding Acquisition Techniques; 2001; Proc. Intl. Soc. Mag. Reson. Med.; 9:799.

(Continued)

Primary Examiner—Andrew W. Johns
Assistant Examiner—Nancy Bitar

(57) ABSTRACT

A novel magnetic resonance imaging method is presented for forming an image of an object from a plurality of signals acquired by an array of receiver antennae, whereas prior to imaging a sensitivity map of each of the receiver antennae is provided, at least two adjacent antennae record signals originating from the same imaging position and the image intensity is calculated from the signals measured by different antennae, wherein the number of phase encoding steps is reduced with respect to the full set thereof. Further the homogeneity of the main magnetic field is defined in a first region of full homogeneity, a second region of moderate homogeneity and a third region of full inhomogeneity, the sensitivity data of the array of receiver antennae is measured by a coarse calibration scan, whereas the full measured sensitivity data is used in the first region, for each point in the second region an estimate of the coil sensitivities is derived by a weighted addition of the measured sensitivities in the neighborhood of that point, and in the third region the sensitivity data is set zero.

7 Claims, 2 Drawing Sheets

U.S. PATENT DOCUMENTS

Figure 1:
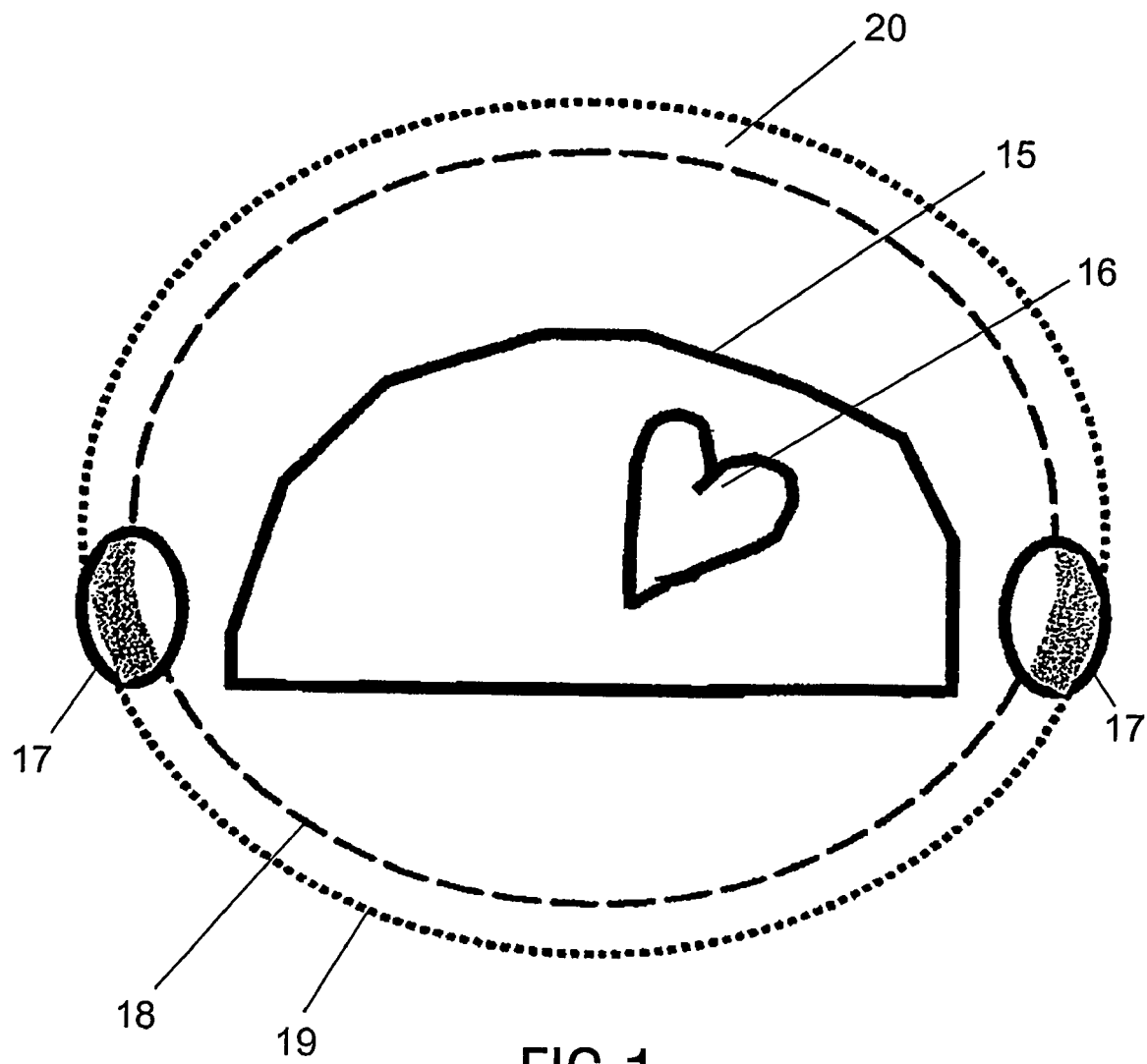

| | | | |
|---|---|---|---|
| 6,326,786 B1 * | 12/2001 | Pruessmann et al. | 324/312 |
| 6,476,606 B2 * | 11/2002 | Lee | 324/309 |
| 6,680,610 B1 | 1/2004 | Kyriakos et al. | |
| 6,717,406 B2 | 4/2004 | Sodickson | |
| 6,771,071 B1 * | 8/2004 | Wright et al. | 324/318 |
| 6,777,934 B2 * | 8/2004 | Takahashi et al. | 324/309 |
| 6,919,722 B2 * | 7/2005 | Angelos et al. | 324/309 |
| 2001/0043068 A1 | 11/2001 | Lee | |
| 2003/0206016 A1 * | 11/2003 | Madore | 324/309 |
| 2004/0155652 A1 * | 8/2004 | Sodickson | 324/307 |

OTHER PUBLICATIONS

Murakami, J.W., et al.; Intensity Correction of Phased-Array Surface Coil Images; 1996; MRM; 35:585-590.

Pruessmann, K.P., et al.; Coil Sensitivity Maps for Sensitivity Encoding and Intensity Correction; 1998; Proc. ISMRM; 2087.

Pruessmann, K.P., et al.; Coil Sensitivity Encoding for Fast MRI; 1998; Proc. ISMRM; 579.

Pruessmann, K.P., et al.; SENSE:Sensitivity Encoding for Fast MRI; 1999; MRM; 42:952-962.

Weiger, M., et al.; Accellerated Cardiac Breathhold Imaging Using Coil Sensitivity Encoding; 1998; Proc. ISMRM; 799.

Weiger, M., et al.; Cardiac Real-Time Acquisition Using Coil Sensitivity Encoding; 1998; Proc. ISMRM; 803.

* cited by examiner

DETERMINATION OF SUBENCODING MRI COIL SENSITIVITIES IN A LOWER ORDER MAGNETIC FIELD

FIELD OF THE INVENTION

The invention relates to a magnetic resonance (MR) method for the imaging of an object from a plurality of signals acquired by an array of receiver antennae, whereas prior to imaging a sensitivity map of each of the receiver antennae is provided, at least tow adjacent antenna record signals originating from the same imaging position and the image intensity is calculated from the signals measured by the different antennae, and wherein the number of phase encoding steps is reduced with respect to the full set thereof.

The invention also relates to an MR device and a computer program product for carrying out such a method.

BACKGROUND OF THE INVENTION

In magnetic resonance imaging there is a general tendency to obtain acceptable images within shorter periods of time. For this reason the sensitivity encoding method called "SENSE" has recently been developed by the Institute of Biomedical Engineering and Medical Informatics, University and ETH Zürich, Switzerland. The SENSE method is based on an algorithm which acts directly on the image as detected by the coils of the magnetic resonance apparatus and in which subsequent encoding steps can be skipped and hence an acceleration of the signal acquisition for imaging by a factor of from two to three can be obtained. Crucial for the SENSE method is the knowledge of the sensitivity of the coils arranged in so called sensitivity maps. In order to accelerate this method there are proposals to use raw sensitivity maps which can be obtained through division by either the "sum-of-squares" of the single coil references or by an optional body coil reference (see e.g. K. Pruessmann et. al. in Proc. ISMRM, 1998, abstracts pp. 579, 799, 803 and 2087). In fact the SENSE method allows for a decrease in scan time by deliberately undersampling k-space, i.e. deliberately selecting a Field-of-View (FOV) that is smaller than the object to be acquired. From this undersampling fold-over artefacts are obtained which can be resolved or unfolded by the use of the knowledge of a set of distinct coils having different coil sensitivity patterns. The undersampling can be in either one of both phase-encoding directions.

It is commonly known that the main magnet of the Philips NT with the Intera 1.5 T magnet (Philips Medical Systems, Best, Netherlands) has a quit sharp distinction between the inner region in which the main magnetic field is homogeneous and the outer region in which the main magnetic field is completely inhomogeneous. For the Intera 1.5 T magnet the inner region of high homogeneity is larger than the usual extent of the human body in the left-to-right direction which is orthogonal to the elongate direction of the magnet. The polynomial expansion of the main magnetic field is zero up to a high-order, which means that there is a quick transition between the inner region or volume of high homogeneity and the outer region of high inhomogeneity.

Other known MR systems have another design of their main magnets, which have a more gradual transition between the high homogeneity region and the region in which the main magnetic field is completely inhomogeneous, i.e. where fields are not sufficient homogeneous for any RF refocusing whatsoever. Such magnets are being mentioned here as of "lower order".

For the set-up of SENSE it is required to provide a sensitivity map of the coils which is done by means of a large voxel gradient echo imaging or fast field echo scan (FFE), which is also known as coarse calibration scan (COCA). This scan is sensitive to signal loss due to intra-voxel dephasing in case of moderate magnetic field inhomogeneities. For this reason up to now the SENSE method is practically only feasible with the Philips MR system because of the high homogeneity of the main magnetic field.

In U.S. Pat. No. 5,910,728 a magnetic resonance imaging apparatus and technique exploits spatial information inherent in a surface coil array to increase MR image acquisition speed, resolution and/or field of view. The MR signal from a combination of coils having an aggregate sinusoidal and cosinusoidal spatial sensitivity profile have an information content somewhat different from that of the usual coil signal. By separating out one or more collected signals corresponding to pure spatial harmonics, these may be used to fill a larger portion of the data space than is done conventionally. Partial signals are thus acquired simultaneously in the component coils of the array and formed into two or more signals corresponding to orthogonal spatial representations. In a Fourier embodiment, lines of the k-space matrix required for image production are formed using a set of separate linear combinations of the component coil signals to substitute for spatial modulations normally produced by phase encoding gradients. The combined MR signal from the inhomogeneous coils is thus shifted in k-space by a predetermined amount dependent from the spatial frequency of the inhomogeneous coil sensitivity. This k-space shift has precisely the same form as the phase-encoding shift produced by evolution in a y gradient. This method is specifically designed for SMASH. However, it does not give any further indication to solve the problem of using SENSE with designs of main magnet of lower order as discussed above.

It is an object of the present invention to allow the application of SENSE with a main magnet with a more gradual transition between the region with a homogeneous magnetic field and the region with a inhomogeneous magnetic field, i.e. with magnets of lower order.

This object of the invention are achieved by a method as defined in claim 1. The invention is further related to an apparatus as defined in claim 6 and to a computer program product as defined in claim 7.

The present invention has the main advantage that main magnets with a less sharp distinction between the inner region of high homogeneity and the outer region of complete inhomogeneity, i.e. magnets of lower order, now can be used also for the above mentioned SENSE method.

These and other advantages of the invention are disclosed in the dependent claims and in the following description in which an exemplified embodiment of the invention is described with respect to the accompanying drawings. Therein shows:

DETAILED DESCRIPTION OF THE DRAWING

FIG. 1 an MR image of a patient with an interesting organ, and

Figure 2:
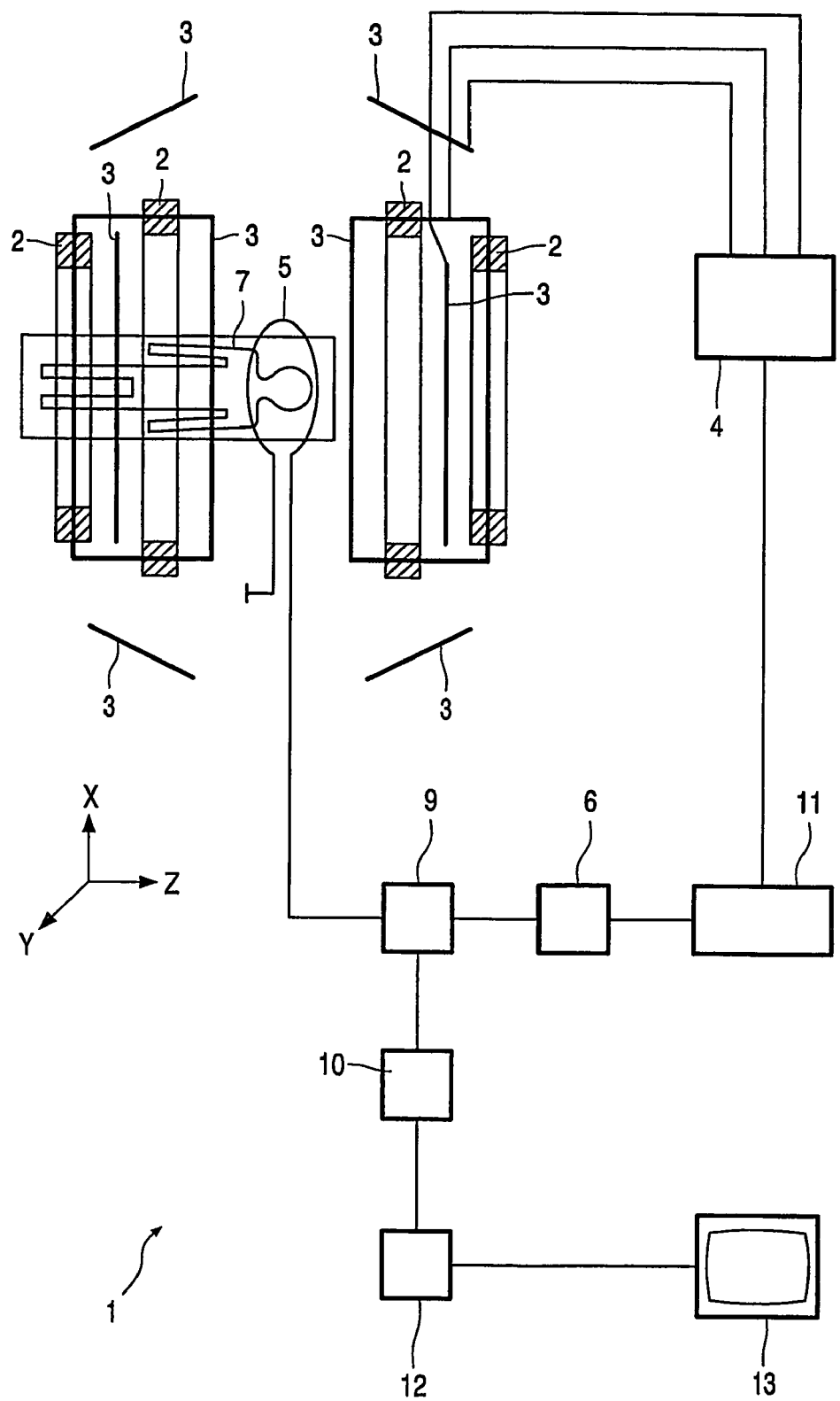

FIG. 2 an MR imaging system for carrying out the method of the present invention.

DESCRIPTION OF THE PREFERRED EMBODIMENT

In the present description, a distinction is made between "homogenous" and "inhomogeneous" magnetic fields. In practical terms commercial available magnet systems do not provide an absolutely homogenous magnetic field. However, the Intera 1.5 T magnet of Philips Medical Systems, Best, Netherlands differentiates from a variety of magnets of other systems in the following important aspects.

The region of high homogeneity is relatively large; in particular, it is larger than the usual extent of the human body in left/right direction.

The polynomial expansion of the field is zero up to a high-order, which means that, colloquially, there is a quick transition between "very homogeneous" within the "homogeneity volume", and "very inhomogeneous" outside.

Many other magnet designs, which are called here of "lower order", have a more gradual transition between a region of high homogeneity and the completely inhomogeneous region, where fields are too inhomogeneous in order to refocus any MR-signal yet. If there is no magnetic field anymore In parallel imaging, such as SENSE, SMASH etc. under-sampling of the MR-signals in k-space is employed. That is, the number of (phase) encoding steps is reduced with respect to a full set of encoding steps. This full set induces the encoding steps required for sampling MR-signals in k-space sufficient for a pre-selected spatial resolution of the MR-image that is reconstructed.

As has been described before, in the SENSE set-up reference data is acquired using a large-voxel FFE scan (the so-called "COCA" scan). This is sensitive to signal-loss due to intra-voxel dephasing in case of moderate magnetic-field inhomogeneities.

On the contrary, there are many types of scans for which in principle SENSE could be used but the scans themselves are much less sensitive to inhomogeneities and thus normally SENSE cannot be applied. RF-refocused scans (SE and particularly TSE) fall in that category, but also short TE scans with small voxels.

In FIG. 1 a normal slice of an MR image of a patient 15 with an interesting organ 16 (the heart) with his arms 17 alongside him is presented in thick lines. The dashed line 18 represents the edge of a first region of high homogeneity of the main magnet, so outside this region the reference or coarse calibration ("COCA") scan shows no meaningful coil-sensitivity information due to dephasing. Outside the dotted line 19, which defines a third region, the inhomogeneity of the magnet system is such high that no sensible signals can be collected. If the magnetic field is vanishing to zero, it is per definition also fully inhomogeneous. A second region 20 between dashed line 18 and the dotted line 19 is of moderate inhomogeneity, i.e. the region within which the SENSE-scan is still able to collect any meaningful signal. The margin between the dashed line 18 and the dotted line 19 is typically about 20 mm wide. The problem area is the intermediate region 20, in which an image is performed by the SENSE-scan and which is possibly folded over an interesting region. However, the reference scan cannot reveal it and hence the system has no knowledge on coil-sensitivities in that region. This results in bad SENSE-unfolding, i.e. artefacts.

The system is designed in such a way that knowledge on expected field inhomogeneities (or their variations) are explicitly known for all locations within the magnet bore. From that knowledge (and knowing the properties of the COCA scan), a figure indicating the "reliability of sensitivity information" can be derived for every point within the magnet bore.

In the COCA scan, the sensitivity information is measured. In the high-homogeneity region it is accurate but elsewhere it is not. The knowledge on where this information is reliable allows for an extrapolation scheme which consists of the following smoothing algorithm: on each position, i.e. point, an estimate of coil sensitivities is derived by a weighted addition of the measured sensitivities of the region around that point; the weights depend on a) The distance between the point and points in its direct neighborhood.

b) The reliability of the information at neighboring points.

Formally, this may be written as $$\hat{s}_c(x,y,z) = \frac{\sum_{(i,j,k) \in Region(x,y,z)} s_c(i,j,k) \cdot r(i,j,k) \cdot D(x-i, x-j, z-k)}{\sum_{(i,j,k) \in Region(x,y,z)} r(i,j,k) \cdot D(x-i, x-j, z-k)} \quad (1)$$

where $\hat{s}_c(x, y, z)$ is the estimate of sensitivity of coil c at position (x, y, z); the measured value of coil sensitivity is s. The function D is a monotonically decreasing function of distance (e.g. (distance+constant)$^{-p}$, with the power p preferably larger than 2). The reliability function r is derived from the knowledge of the field inhomogeneity; more specifically, it is preferably a function that is 1 in case of high homogeneity and 0 in regions with high inhomogeneity, e.g., $$r = e^{-\frac{\|grad(B)\|^2}{grad\_ref^2}} \quad (2)$$

where "grad_ref" is a constant that is chosen in accordance with the properties of the the COCA scan.

In order to apply magnet systems with a higher degree of inhomogeneity, i.e. magnets of lower order, the estimated sensitivities ŝ are rather used than the measured sensitivities s when reconstructing SENSE-images in the region of moderate inhomogeneity.

A practical embodiment of an MR device is shown in FIG. 2, which includes a first magnet system 2 for generating a steady magnetic field, and also means for generating additional magnetic fields having a gradient in the X, Y, Z directions, which means are known as gradient coils 3. The Z direction of the co-ordinate system shown corresponds to the direction of the steady magnetic field in the magnet system 2 by convention, which only should be linear. The measuring co-ordinate system x, y, z to be used can be chosen independently of the X, Y, Z system shown in FIG. 2. The gradient coils 3 are fed by a power supply unit 4. An RF transmitter coil 5 serves to generate RF magnetic fields and is connected to an RF transmitter and modulator 6. A receiver coil is used to receive the magnetic resonance signal generated by the RF field in the object 7 to be examined, for example a human or animal body. This coil 5 represents an array of multiple receiver antennae. Furthermore, the magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9. The control unit 11 controls the RF transmitter and modulator 6 and the power supply unit 4 so as to generate special pulse sequences which contain RF pulses and gradients. The control unit 11 also controls detection of the MR signal(s), whose phase and amplitude obtained from the demodulation unit 10 are applied to a processing unit 12. The control unit 11 and the respective receiver coils 3 and 5 are equipped with control means to enable switching between their detection pathways on a sub-repetition time basis (i.e. typically less than 10 ms). These means comprise inter alia a current/voltage stabilization unit to ensure reliable phase behavior of the antennae, and one or more switches and analogue-to-digital converters in the signal path between coil and processing unit 12. The processing unit 12 processes the presented signal values so as to form an image by transformation. This image can be visualized, for example by means of a monitor 13.

The invention claimed is:

1. A magnetic resonance imaging method for forming an image of an object from a plurality of signals acquired by an array of receiver antennae, a sensitivity map of each of the receiver antennae being provided, and a number of applied encoding steps being reduced with respect to the full set thereof, wherein the homogeneity of the main magnetic field is specified in a first region of full homogeneity, a second region of moderate homogeneity and a third region of full inhomogeneity, and that the sensitivity data of the array of receiver antennae is measured by a coarse calibration scan, wherein the full measured sensitivity data is used in the first region, for positions in the second region an estimate of the coil sensitivities is derived by a weighted addition of the measured sensitivities in the neighborhood of the position at issue, and in the third region the sensitivity data is set to zero.

2. A method as claimed in claim 1, wherein weighting for the position at issue depends on the distance between the points at issue of the second region and positions in its neighborhood and depends on a reliability function of the data obtained at those neighboring points.

3. A method as claimed in claim 2, wherein the estimate of the sensitivity of a coil (c) at a position (x, y, z) is defined by following equation:

$$\hat{s}_c(x, y, z) = \frac{\sum_{(i,j,k) \in Region(x,y,z)} s_c(i, j, k) \cdot r(i, j, k) \cdot D(x-i, x-j, z-k)}{\sum_{(i,j,k) \in Region(x,y,z)} r(i, j, k) \cdot D(x-i, x-j, z-k)}$$

wherein $\hat{s}_c(x, y, z)$ is the estimate of sensitivity of coil c at position (x, y, z); s is the measured value of coil sensitivity; r is a reliability function and D is a monotonically decreasing function of the distance between the point and its neighboring points.

4. A method as claimed in claim 3, wherein the reliability function is derived from the knowledge of the inhomogeneity of the main magnetic field.

5. A method as claimed in claim 4, wherein the reliability function $$r = e^{-\frac{\|grad(B)\|^2}{grad\_ref^2}}$$

where "grad_ref" is a constant that is determined by the properties of the coarse calibration scan.

6. A magnetic resonance imaging apparatus for obtaining an MR image from a plurality of signals comprising:
   means for excitation of spins in a part of the object,
   a plurality of receiver antennae,
   means for measuring MR signals along a predetermined trajectory containing a plurality of lines in k-space by application of a read gradient and other gradients, wherein a number of phase encoding steps applied is reduced with respect to the full set thereof,
   means for measuring sensitivity data for each of the receiver antennae by a coarse calibration scan,
   means for specifying the homogeneity of the main magnetic field in a first region of full homogeneity, a second region of moderate homogeneity and a third region of full inhomogeneity, the sensitivity data of the array of receiver antennae is measured by a coarse calibration scan with reference data,
   means for deriving an estimate of the coil sensitivities for positions in the second region by a weighted addition of the measured sensitivities in the neighborhood of the position at issue, and
   means for setting the sensitivity data in the third region to zero.

7. A computer readable medium having a stored computer program comprising the step of:
   measuring sensitivity data for each of the receiver antennae by a coarse calibration scan with reference data,
   specifying the homogeneity of the main magnetic field in a first region of full homogeneity, a second region of moderate homogeneity and a third region of full inhomogeneity, the sensitivity data of the array of receiver antennae is measured by a coarse calibration scan,
   deriving an estimate of the coil sensitivities for positions in the second region by a weighted addition of the measured sensitivities in the neighborhood of the position at issue, and
   setting the sensitivity data in the third region to zero.

* * * * *